(12) United States Patent
Yamada et al.

(10) Patent No.: US 6,900,671 B2
(45) Date of Patent: May 31, 2005

(54) CURRENT-VOLTAGE CONVERSION CIRCUIT

(75) Inventors: Hiroyuki Yamada, Kanagawa (JP);
Shigeyuki Tamura, Tokyo (JP);
Kuniichi Ikemura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/325,902

(22) Filed: Dec. 23, 2002

(65) Prior Publication Data

US 2003/0234691 A1 Dec. 25, 2003

(30) Foreign Application Priority Data

Jun. 21, 2002 (JP) .................................... 2002-180763

(51) Int. Cl.⁷ .......................................... H02M 11/00
(52) U.S. Cl. ..................................... 327/103; 327/112
(58) Field of Search ............................ 327/103, 112, 327/283, 284; 331/57

(56) References Cited

U.S. PATENT DOCUMENTS 6,384,620 B1 * 5/2002 Yamada et al. ................ 326/29
6,538,487 B2 * 3/2003 Murayama et al. .......... 327/232

FOREIGN PATENT DOCUMENTS

| JP | 05-242405 | 9/1993 | | |
|---|---|---|---|---|
| JP | 10-284955 | 10/1998 | | |
| JP | 2002-43925 | 2/2002 | | |
| JP | 2002-043925 | 2/2002 | | |
| KR | 2001063196 A | * | 7/2001 | ............ H03K/5/14 |

OTHER PUBLICATIONS

"10Gb/s Low Power Limiting Amplifier for Optical Communication systems" Murayama et al., Electronics Society Conference of the Electronic Information and Communications Society (Denshi Joho Tsushin Gakkai) 1999, C–10–24 (disclosed on p. 1 of the specification).

* cited by examiner

*Primary Examiner*—Quan Tra
(74) *Attorney, Agent, or Firm*—Rabin & Berdo, P.C.

(57) ABSTRACT

It is an object of the present invention to provide a current-voltage conversion circuit in which the sensitivity varies in accordance with the amplitude of the input signal. In the current-voltage conversion circuit of the present invention, n+1 (n is an even number) amplifying inverters are connected in series between an input terminal and an output terminal; furthermore, the input of a negative feedback circuit constructed from an integrating circuit and a negative feedback inverter is connected to the output side of the $n^{th}$-stage amplifying inverter, and the output of this negative feedback circuit is connected to the input side of the first-stage amplifying inverter. The integrating circuit outputs the mean value of the output potential of the $n^{th}$-stage amplifying inverter into the negative feedback inverter, and the negative feedback inverter controls the current that flows the ground line from the input terminal in accordance with the output voltage of the integrating circuit. As a result, the sensitivity of the current-voltage conversion circuit varies accordingly.

17 Claims, 9 Drawing Sheets

CURRENT-VOLTAGE CONVERSION CIRCUIT

BACKGROUND OF THE INVENTION

1. Field of the Invention

The present invention relates to a current-voltage conversion circuit, and more particularly to a current-voltage conversion circuit with a limiting function which is used for example in optical communications or the like. This application is a counterpart application of Japanese application Serial Number 180763/2002, filed Jun. 21, 2002, the subject matter of which is incorporated herein by reference.

2. Description of the Related Art

Current-voltage conversion circuits contain signal amplifiers used in various applications. A limiting amplifier which is used for example in the relays of optical communications systems or the like is known as one type of signal amplifier. Known amplifiers of this type include (for example) the limiting amplifier disclosed by Murayama et al. in "10 Gb/s Low Power Limiting Amplifier for Optical Communication Systems" (Electronics Society Conference of the Electronic Information and Communications Society (Denshi Joho Tsushin Gakkai) 1999, C-10-24).

Figure 7:
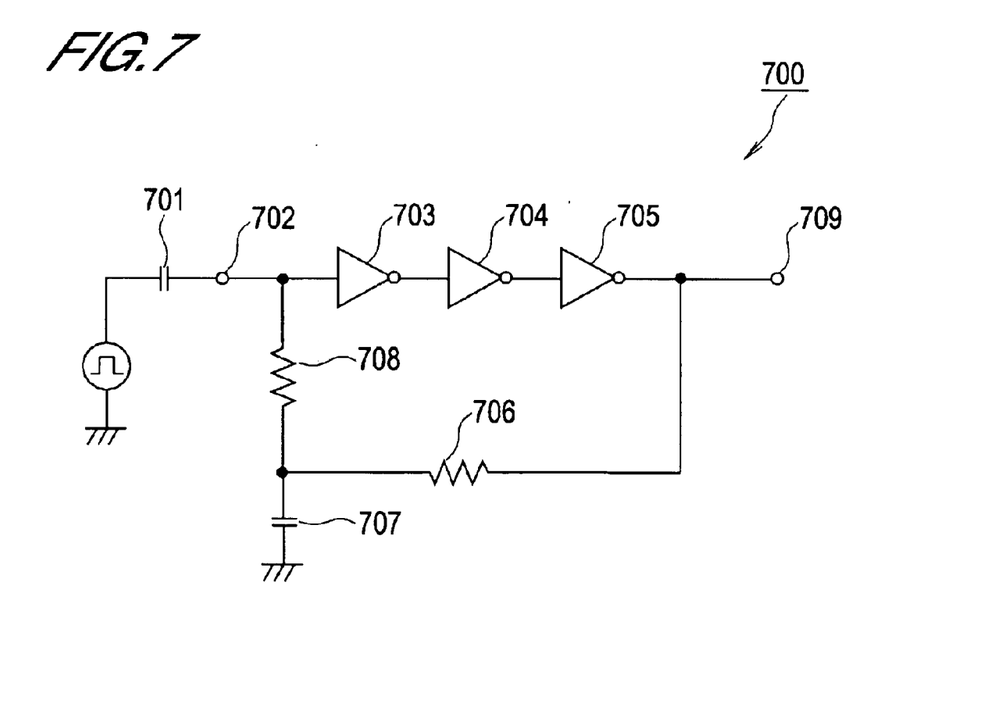
FIG. 7 is a circuit diagram which shows the construction of a conventional limiting amplifier.

FIG. 7 is a circuit diagram which shows the essential construction of the limiting amplifier disclosed in the above-mentioned reference.

In the limiting amplifier 700 shown in FIG. 7, the voltage signal is input into an input terminal 702 via a capacitor 701. The voltage signal that is input into the input terminal 702 will hereafter be referred to as the input signal. The input signal passes through inverters 703, 704 and 705 used for amplification, and is output from an output terminal 709. The logical level of the input signal approaches the logical levels set in the inverters 703, 704 and 705 used for amplification as a result of passing through these inverters. For example, inverters with a DCFL (direct coupled FET logic) constructed from MESFET (metal semiconductor field effect transistors) made of GaAs are used as the amplifying inverters 703, 704 and 705; the structure of these inverters will be described later.

In the case of such a limiting amplifier 700, in order to amplify the input signal with a high degree of precision, it is desirable that the voltage value that constitutes the center of the amplitude of the input signal and the logical threshold values of the inverters 703 through 705 be caused to coincide. The reason for this is as follows: specifically, if the voltage value constituting the center of the amplitude of the input signal and the logical threshold values of the inverters 703 through 705 do not coincide, the ratio of the high level of the input signal will be higher than the ratio of the low level in cases where the voltage value that constitutes the center of the amplitude of the input signal is higher than the logical threshold values of the inverters 703 through 705, and the ratio of the high level of the input signal will be lower than the ratio of the low level in cases where the voltage value that constitutes the center of the amplitude of the input signal is lower than the logical threshold values of the inverters 703 through 705. As a result, amplification will be performed on an input signal in which the ratios of the high level and low level are non-uniform (non-uniform duty ratio).

Accordingly, in the limiting amplifier 700 shown in FIG. 7, a negative feedback circuit consisting of resistance elements 706 and 708 and a capacitor 707 is installed in order to cause the voltage value constituting the center of the amplitude of the input signal and the logical threshold values of the inverters 703 through 705 to coincide. The resistance element 706 and capacitor 707 form an integrating circuit, and produce the mean value of the output voltage of the inverter 705. This mean value is superimposed on the input signal of the inverter 703 via the resistance element 708. Accordingly, in the case of the limiting amplifier shown in FIG. 7, the voltage value that constitutes the center of the amplitude of the input signal and the logical threshold values of the inverters 703 through 705 can be caused to coincide with an extremely high degree of precision by means of the abovementioned negative feedback circuit, so that (for example) amplification can be performed on an input signal in which the ratios of the high level and low level of the input signal are the same (i. e., an input signal with a duty ratio of 50%). Furthermore, the resistance values of the respective resistance elements range from several tens of ohms to several thousand ohms, and the capacitance values of the respective capacitors range from several hundred pF to several hundred nF.

Figure 8:
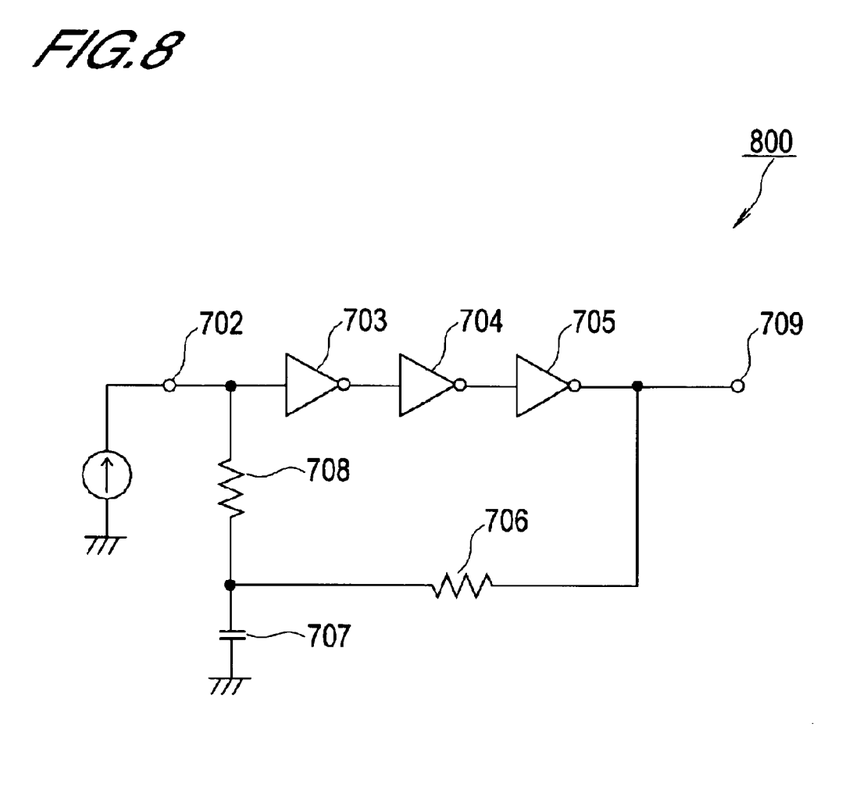
FIG. 8 is a circuit diagram which shows the construction of a conventional current-voltage conversion circuit.

FIG. 8 shows the construction of a current-voltage conversion circuit equipped with a limiting function that uses such a limiting amplifier 700. FIG. 8 is a circuit diagram which shows the construction of this current-voltage conversion circuit. The current-voltage conversion circuit 800 equipped with a limiting function shown in FIG. 8 has a construction in which the current signal is input from the input terminal 702 without passing through a capacitor 701. This current-voltage conversion circuit 800 utilizes the voltage drop of the resistance element 708 to convert the current signal into a voltage signal. Accordingly, the product of the amplitude of the current signal and the resistance value of the resistance element 708 is equal to the amplitude of the voltage signal that is input into the inverter 703.

In the current-voltage conversion circuit 800, it is necessary to increase the amplitude of the voltage signal that is input into the inverter 703 in order to obtain a high sensitivity. Accordingly, in the current-voltage conversion circuit 800, in order to obtain a large signal as the input signal, the amplitude of the voltage signal that is input into the inverter 703 is increased by increasing the resistance value of the resistance element 708.

However, in cases where the inverters 703 through 705 of the current-voltage conversion circuit 800 are constructed using a DCFL structure of MESFETs made of GaAs, the following drawback arises: namely, if the amplitude of the input signal is increased, distortion occurs in the waveform of the voltage signal that is input into the inverter 703.

The term "distortion" in this case refers to a phenomenon in which the rate by which the voltage increases relative to the rate by which the current increases is reduced in the current-voltage characteristics (in other words, a phenomenon in which the slope of the current-voltage characteristic curve is reduced). Such distortion is generated on the basis of the following principle: specifically, in the current-voltage conversion characteristics of the negative feedback circuit, since the resistance value of the resistance element 708 within the negative feedback circuit is fixed, a Schottky current is generated as the potential of the voltage signal reaches a high level exceeding the Schottky barrier of the DCFL, and this Schottky current flows into the gate of the inverter 703. In this case, the voltage signal that is input into the inverter 703 is interfered with by the Schottky current. As a result, distortion is generated in the waveform of the voltage signal that is input into the inverter 703.

SUMMARY OF THE INVENTION

It is an object of the present invention to provide a current-voltage conversion circuit which can prevent the generation of distortion in the waveform of the voltage signal that is input into the amplifying inverters while obtaining a high sensitivity with respect to the input signal in cases where the amplitude of the input signal is large (i. e., in cases where the input signal is a large signal), and which also makes it possible to obtain a high sensitivity with respect to the input signal even in cases where the amplitude of the input signal is small (i. e., in cases where the input signal is a small signal).

In order to solve the abovementioned problems, the current-voltage conversion circuit of the present invention comprises a plurality of amplifying inverters that are connected in series between an input terminal and an output terminal, an integrating circuit which inputs and integrates the output potential of one of the amplifying inverters, and a negative feedback inverter which controls the current that flows between the input terminal and the power supply line in accordance with the output voltage of the integrating circuit.

The current-voltage conversion circuit performs current-voltage conversion of the input signal by utilizing the source-drain resistance of transistors disposed inside the negative feedback inverter.

In this case, the source-drain resistance varies in inverse proportion to the amplitude of the input signal. Furthermore, the current-voltage characteristics of the transistor disposed inside the feedback inverter vary according to the gate voltage. Accordingly, the current-voltage conversion circuit of the present invention can vary the current-voltage characteristics of the feedback inverter in accordance with the amplitude of the input signal; as a result, an effect equivalent to that obtained when the resistance value of the resistance element 708 in a conventional feedback circuit is made variable can be achieved.

In the current-voltage conversion circuit of the present invention, the source-drain resistance of the transistors disposed inside the negative feedback inverter is small in cases where the input signal is a large signal; accordingly, the amplitude of the input voltage can be suppressed, so that distortion of the waveform of the voltage signal that is input into the amplifying inverter can be reduced.

Moreover, in the current-voltage conversion circuit of the present invention, the source-drain resistance of the transistors disposed inside the negative feedback inverter is large in cases where the input signal is a small signal; accordingly, the input voltage is increased, so that a high sensitivity can be obtained with respect to the input signal.

BRIEF DESCRIPTION OF THE DRAWINGS

The foregoings and other objects, features and advantages of the present invention will be better understood from the following description taken in connection with the accompanying drawings, in which.

DESCRIPTION OF THE PREFERRED EMBODIMENTS

Embodiments of the present invention will be described below with reference to the attached figures. Furthermore, in the figures, the sizes, shapes and positional relationships of the respective constituent components are merely shown in schematic terms to an extent that allows understanding of the present invention, and all numerical values described below are merely examples.

<First Embodiment>

A current-voltage conversion circuit constituting a first embodiment of the present invention will be described with reference to FIGS. 1 through 3.

Figure 1:
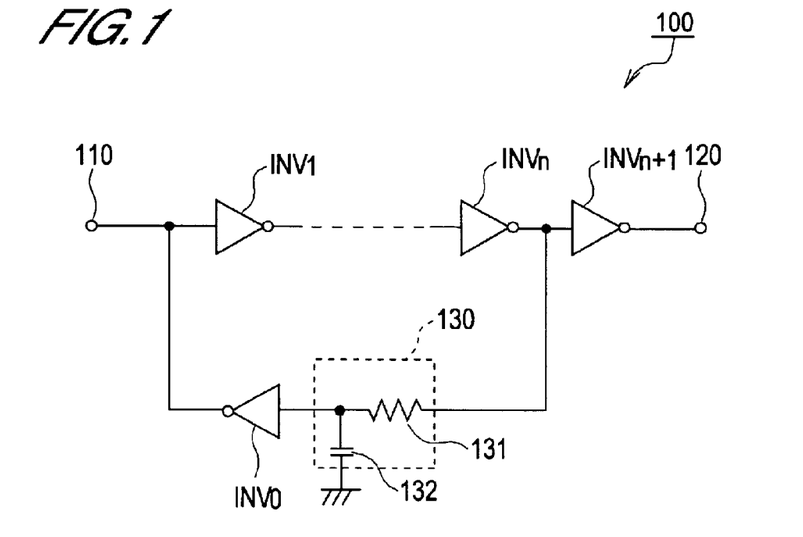
FIG. 1 is a circuit diagram which shows the construction of a current-voltage conversion circuit constituting a first embodiment of the present invention.

FIG. 1 is a circuit diagram which shows the overall construction of the current-voltage conversion circuit of the present embodiment.

As is shown in FIG. 1, this current-voltage conversion circuit 100 comprises a signal input terminal 110, amplifying inverters INV1 through INVn+1, an output terminal 120, an integrating circuit 130, and a feedback inverter INV0.

The input terminal 110 inputs a current signal from the outside.

The amplifying inverters INV1 through INVn+1 are connected in series. The input of the first-stage amplifying inverter INV1 is connected to the input terminal 110. Furthermore, the output of the final-stage amplifying inverter INVn+1 is connected to the output terminal 120. In the present embodiment, n is an even number.

The integrating circuit 130 comprises a resistance element 131 and a capacitor 132. One end of the resistance element 131 is connected to the output of an even-numbered amplifying inverter. In the example shown in FIG. 1, one end of the resistance element 131 is connected to the output of the nth-stage amplifying inverter INVn. One end of the capacitor 132 is connected to the other end of the resistance element 131. Furthermore, the other end of this capacitor 132 is connected to the ground line.

The input of the negative feedback inverter INV0 is connected to the other and of the resistance element 131.

Furthermore, the output of this negative feedback inverter INV0 is connected to the input of the first-stage amplifying inverter INV1. Moreover, in the current-voltage conversion circuit 100, the number of negative feedback inverters is set as an odd number, and the circuit is constructed so that the input of the negative feedback inverter INV0 is connected to the output of an even-numbered amplifying inverter. However, the current-voltage conversion circuit 100 may also be constructed so that the number of negative feedback inverters is set as an even number, and so that the inputs of the negative feedback inverters are connected to the output of an odd-numbered amplifying inverter. In other words, it is sufficient if the current-voltage conversion circuit 100 is constructed so that the high level and low level of the signal that is output from the negative feedback inverter INV0 are the opposites of those of the input signal that is input into the first-stage amplifying inverter INV1.

Figure 2:
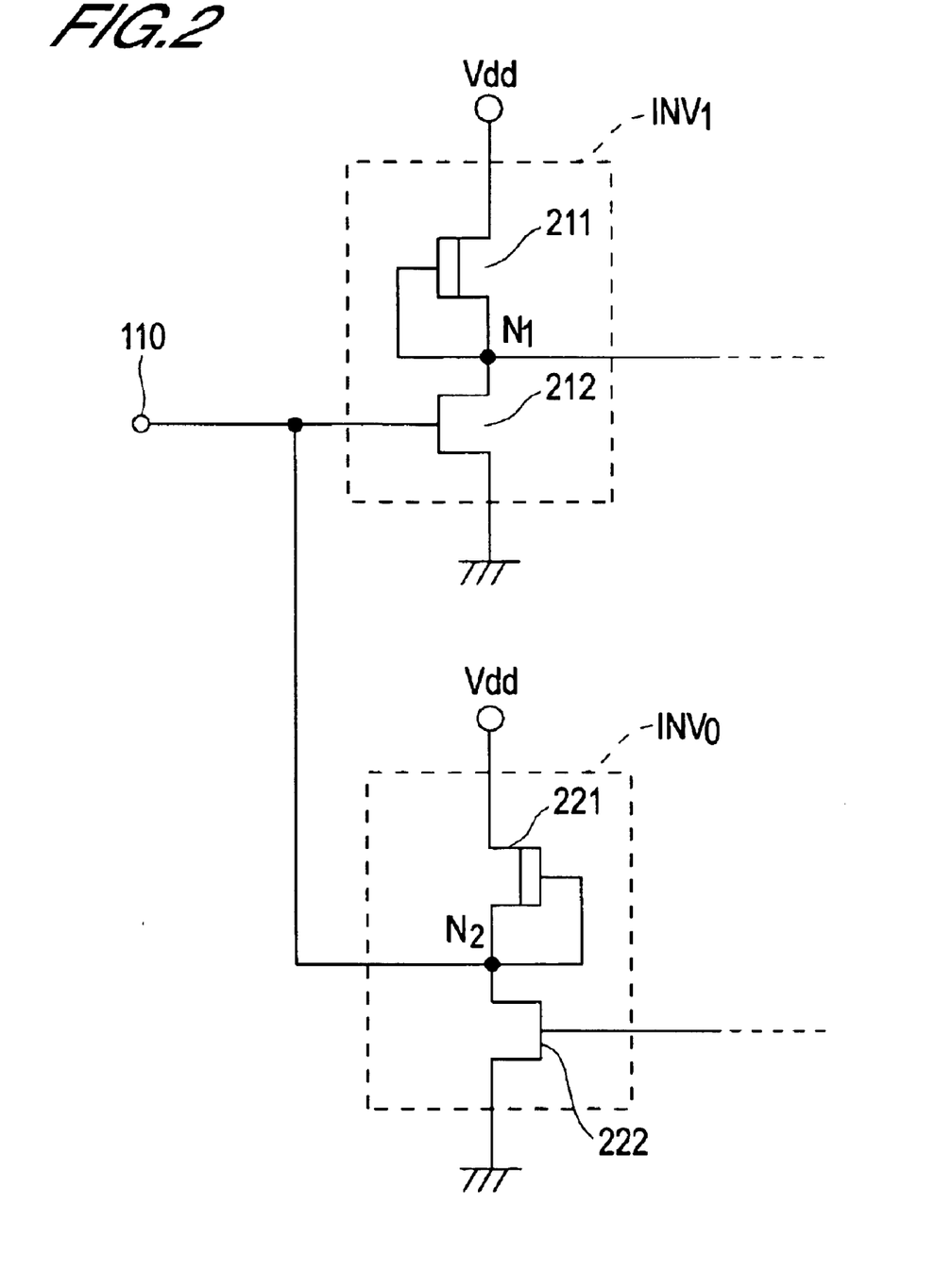
FIG. 2 is a circuit diagram which shows the essential construction of the current-voltage conversion circuit of the first embodiment.

FIG. 2 is a circuit diagram which shows the internal structures of the inverters INV0 and INV1. Furthermore, the internal structures of the other inverters INV2 through INVn+1 are also the same.

As is shown in FIG. 2, the inverter INV1 comprises a depression type FET 211 and an enhancement type FET 212. The source of the depression type FET 211 is connected to the power supply line Vdd. Furthermore, the gate and drain of the depression type FET 211 are connected to the drain of the enhancement type FET 212 by the node N1. This node N1 is the output of the inverter INV1. The source of the enhancement type FET 212 is connected to the ground line. Furthermore, the gate of the enhancement type FET 212 is the input of the inverter INV1, and is connected to the input terminal 110 and output of the inverter INV0.

The depression type FET 211 is constantly "on", and acts as a constant current supply. Accordingly, when the enhancement type FET 212 is on, the output voltage (i. e., the potential of the node N1) is at a low level, and when the enhancement type FET 212 is off, the output voltage is at a high level.

The inverter INV0 comprises a depression type FET 221 and an enhancement type FET 222. The source of the depression type FET 221 is connected to the power supply line Vdd. Furthermore, the gate and drain depression type FET 221 are connected to the drain of the enhancement type FET 222 by the node N2. This node N2 is the output of the inverter INV0, and is connected to the input of the inverter INV1 (i. e., the gate of the enhancement type FET 212). The source of the enhancement type FET 222 is connected to the ground line. Furthermore, the gate of the enhancement type FET 222 is the input of the inverter INV0, and is connected to the second end of the resistance element 131 and the first end of the capacitor 132 (see FIG. 1). The depression type FET 221 is constantly "on", and acts as a constant current source. Accordingly, when the enhancement type FET 222 is on, the output voltage (i. e., the potential of the node N2) is at a low level, and when the enhancement type FET 222 is off, the output voltage is at a high level.

Next, the operation of the current-voltage conversion circuit 100 of the present embodiment will be described.

A current signal is input from the input terminal 110 as an input signal. This current signal is converted into a voltage signal by flowing through the enhancement type FET 222 (see FIG. 2). This voltage signal is amplified by the amplifying inverters INV1 through INVn+1, and is output from the output terminal 120.

The output voltage of the nth-stage amplifying inverter INVn is applied not only to the n+1$^{st}$-stage amplifying inverter INVn+1, but also to the resistance element 131 (see FIG. 1). As a result, the integrating circuit 130 produces a potential that corresponds to the mean value of the output voltage of the amplifying inverter INVn. This mean value is applied to the input of the negative feedback inverter INV0 (i. e., to the gate of the enhancement type FET 222). Specifically, the gate voltage Vgs of he enhancement type FET 222 is low in cases where the current signal that is input from the input terminal 110 is a signal with a small amplitude (i. e., a small signal), and is high incases where this signal is a signal with a large amplitude (i. e., a large signal).

The current-voltage characteristics of the enhancement type FET 222 vary according to the gate voltage Vgs. Accordingly, the current-voltage conversion circuit 100 of the present embodiment is equivalent to a case in which the resistance value of the resistance element 708 inside the negative feedback circuit in a conventional current-voltage conversion circuit 800 (see FIG. 8) is made variable in accordance with the amplitude of the input signal.

Figure 3:
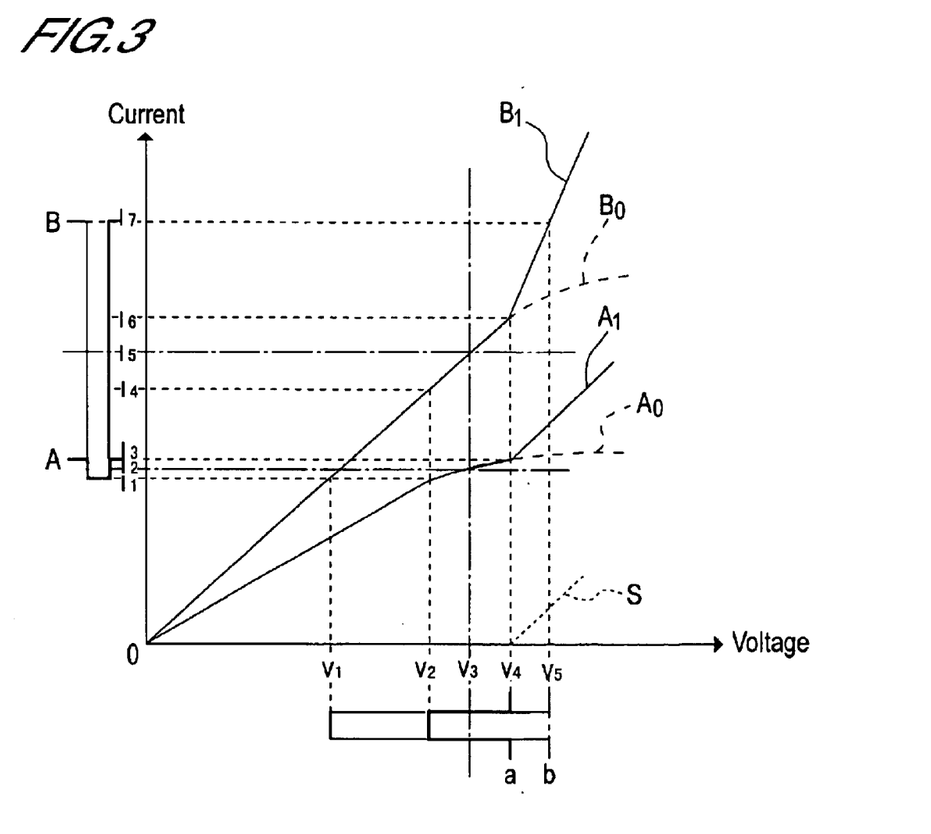
FIG. 3 is a characteristic graph which is used to illustrate the operating principle of the current-voltage conversion circuit of the first embodiment.

FIG. 3 is a graph which shows the current-voltage characteristics of the current-voltage conversion circuit 100.

In FIG. 3, the waveforms A and B drawn on the left side of the vertical axis respectively indicate a current signal with a small amplitude (i. e., a small current signal) and a current signal with a large amplitude (i. e., a large current signal); furthermore, the waveforms a and b drawn beneath the horizontal axis respectively indicate the voltage signal corresponding to the waveform A and the voltage signal corresponding to the waveform B.

Furthermore, the curves A0 and B0 indicate the current-voltage characteristics of the enhancement type FET 222 in a case where the enhancement type FET 222 is operated alone. In regard to the curves A0 and B0, the vertical axis in FIG. 3 indicates the current value of the drain-source current Ids of the enhancement type FET 222, and the horizontal axis indicates the voltage value of the drain-source voltage Vds. Here, the curve A0 shows an example of a case in which a small signal is input from the input terminal 110. Furthermore, the curve B0 shows an example of a case in which a large signal is input from the input terminal 110. Since the gate potential Vgs thus drops as the amplitude of the input signal decreases, the enhancement type FET 222 becomes saturated at a small current. Accordingly, as the input signal becomes smaller, the negative feedback inverter INV0 shows a current-voltage characteristic in which the slope of the curve is small.

Furthermore, the curves A1 and B1 indicate the input current—input voltage characteristics of the current-voltage conversion circuit 100. Specifically, in regard to the curves A1 and B1, the vertical axis in FIG. 3 indicates the current value of the input signal (i. e., the value of the current that is input into the input terminal 110), and the horizontal axis indicates the input voltage value of the amplifying inverter INV1 (i. e., the value of the voltage that is input into the amplifying inverter INV1). Furthermore, the input voltage valve is also the value of the gate voltage Vgs of the enhancement type FET 212. When the input voltage value exceeds a specified value, a portion of the input current flows from the gate of the enhancement type FET 212 into the source as a Schottky current S. Accordingly, the input current-input voltage characteristics A1 and B1 of the current-voltage conversion circuit 100 are characteristics in which the Schottky current S is added to the current-voltage characteristics A0 and B0 of the enhancement type FET 222.

In the case of the waveform A in FIG. 3, the current value I1 is the low level, and the current value I3 is the high level; the waveform A oscillates between these values. Furthermore, the current value I2 is the center of the amplitude of the waveform A.

In the case of the waveform B, the current value I1 is the low level, and the current value I7 is the high level; the waveform B oscillates between these values. Furthermore, the current value I5 is the center of the amplitude of the waveform B.

The waveform a is obtained by projecting the waveform A onto the horizontal axis, and projecting the point of intersection between the waveform A and the curve A1 downward. In the case of the waveform a, the voltage value V2 is the low level, and the voltage value V4 is the high level; the waveform a oscillates between these values. Furthermore, the voltage value V3 is the center of the amplitude of the waveform a.

The waveform b is obtained by projecting the waveform B onto the horizontal axis, and projecting the point of intersection between the waveform B and the cure B1 downward. In the case of the waveform b, the voltage value V1 is the low level, and the voltage value V5 is the high level; the waveform b oscillates between these values.

Furthermore, in FIG. 3, the dotted lines indicated projections from the respective current values I1 and I3 in the waveform A onto the curve A1, projections from the respective current values I1, I4, I6 and I7 in the waveform B onto the curve B1, projections from the respective voltage values V2 and V4 in the waveform a onto the curve A1, and projections from the respective voltage values V1, V2, V4 and V5 in the waveform b onto the curve B1. Moreover, in FIG. 3, the one-dot chain lines indicate a projection from the current value I2 constituting the center of the amplitude of the waveform A onto the curve A1, a projection from the current value I5 constituting the center of the amplitude of the waveform B onto the curve B1, and a projection from the voltage value V3 constituting the center of the amplitude of the waveform a onto the curve B1.

In order obtain the current-voltage characteristics shown in FIG. 3, the current-voltage conversion circuit 100 is set as described below.

The voltage value of the output signal from the output terminal 120 and the current value of the input signal from the input terminal 110 in cases where the input signal is a small signal are set in the current-voltage conversion circuit 100 when the current-voltage conversion circuit 110 is designed.

The negative feedback circuit of the current-voltage conversion circuit 100 is set so that such specifications of the current-voltage conversion circuit 100 are satisfied, e. g., so that the voltage value constituting the center of the amplitude of the voltage signal that is output is V3, and so that the current value constituting the center of the amplitude of the input signal is I2, in cases where the input signal is a small signal.

Figure 9:
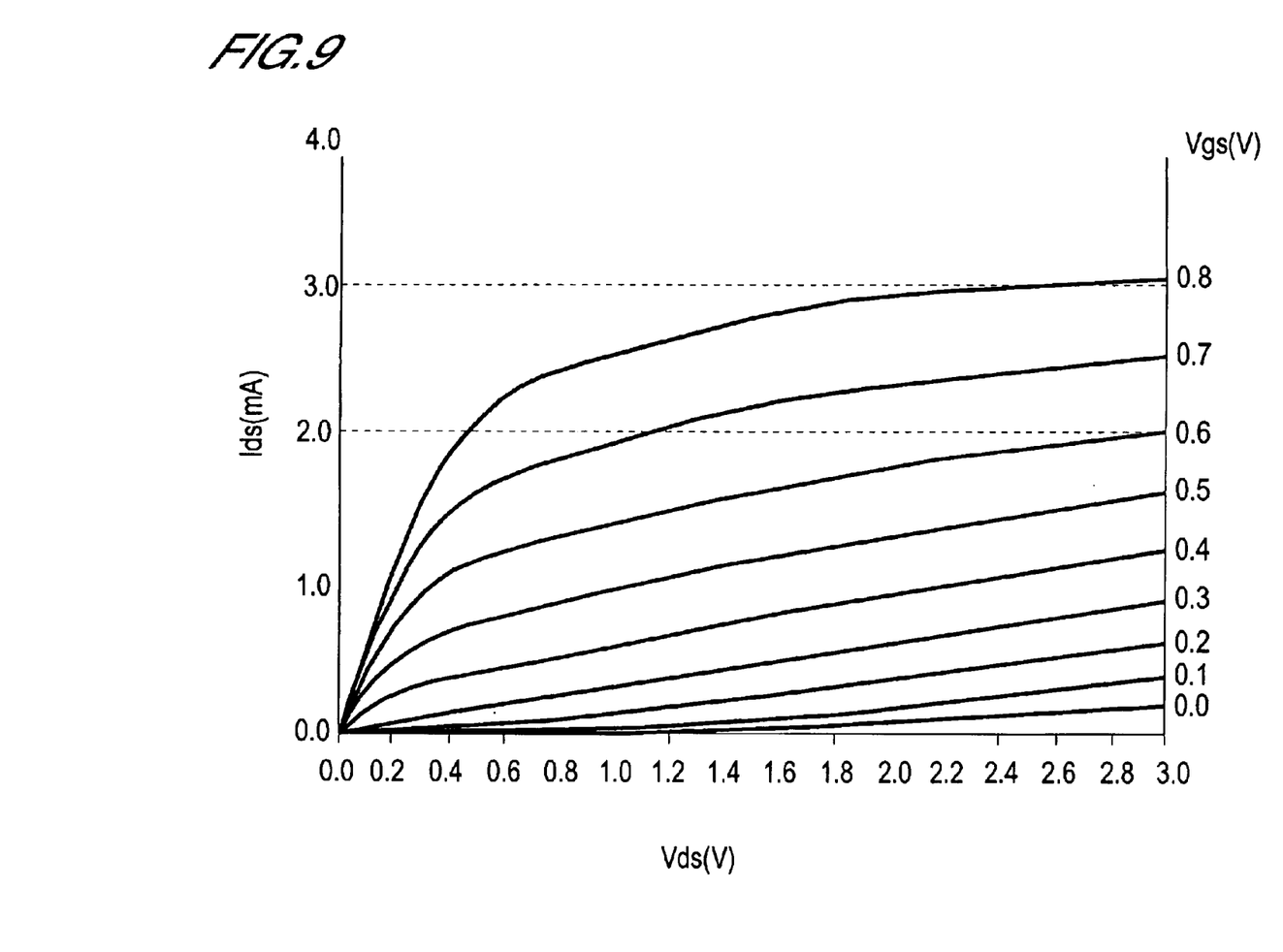
FIG. 9 is a graph which shows the current-voltage characteristics of a common enhancement type FET.

The enhancement type FET 222 inside the negative feedback circuit is set so that the negative feedback circuit satisfies such specifications, e. g., so that the current-voltage characteristic curve of the FET 222 is the curve A0 (on which a point of intersection between the voltage value V3 and current value I2 exists) among the plurality of curves shown in FIG. 9. Furthermore, FIG. 9 is a graph which shows the current-voltage characteristics of a common transistor. Nine curves are drawn in FIG. 9; in actuality, however, an infinite number of curves that are slightly shifted exist.

In this case, furthermore, the enhancement type FET 222 is set so that this FET operates in the region of saturation of the curve A0. This is done in order to cause the FET 222 to function as a resistance element with an extremely large resistance value, so that the current-voltage conversion circuit 100 can obtain a high sensitivity with respect to the input signal. Moreover, the "region of saturation" of the curve A0 refers to a region in which the slope of the current-voltage characteristic curve is small (i. e., a region in which the rate at which the voltage increases relative to the rate at which the current increases is large), as in the case of the region exceeding V2 in FIG. 3.

Furthermore, the enhancement type FET 222 is set so that this FET operates in a region in which the high level potential of the voltage signal does not exceed the Schottky barrier of the DCFL. This "region in which the high level potential of the voltage signal does not exceed the Schottky barrier of the DCFL" refers to a region in which the voltage value is V4 or lower.

Accordingly, the enhancement type FET 222 is set so that this FET operates in a region between the voltage values of V2 and V4, with the voltage value V3 as the center of the amplitude, in cases where the input signal is a small signal. Furthermore, in FIG. 3, an example is shown in which the voltage value V3 is the center value between the voltage value V2 and voltage value V4. Moreover, in cases where the input signal is a small signal, the current values to which the voltage values V2 and V4 correspond are I1 and I3, respectively.

Furthermore, the negative feedback circuit of the current-voltage conversion circuit 100 is set so that the voltage value constituting the center of the amplitude of the voltage signal that is output is V3, and so that the current value constituting the center of the amplitude of the input signal is I5, in cases where the input signal is a large signal. Moreover, the reason that the voltage value is set at V3 is to ensure that logical threshold value in cases where the input signal is a large signal and the logical threshold value in cases where the input signal is a small signal are the same. The reason for this is as follows: since the logical threshold value is the gate voltage Vgs of the enhancement type FET 212 of the amplifying inverter INV1, the FET 212 can ensure that the waveform of the signal that is output from the node N1 in cases where the input signal is a large signal and the waveform of the signal that is output from the node N1 in cases where the input signal is a small signal are uniform. Specifically, this is done so that the FET 212 can ensure that the duty ratio of the signal that is output from the node N1 in cases where the input signal is a large signal and the duty ratio of the signal that is output from the node N1 in cases where the input signal is a small signal are the same.

Furthermore, enhancement type FET 222 inside the negative feedback circuit is set so that the diffraction satisfies such specifications. For example, the FET 222 is set so that the current-voltage characteristic curve of the FET 222 is the curve B0 (on which a point of intersection between the voltage value V3 and the current value I5 exists) among the plurality of curves shown in FIG. 9.

In this case, furthermore, the enhancement type FET 222 is set so that this FET operates in the non-saturated region, and overlaps with the region of the same voltage values as in cases where the input signal is a small signal (i. e., so that this FET operates in the region of the voltage values V1 through V5). This is done in order to ensure that even in cases where the input signal is large, the current-voltage conversion circuit 100 can obtain a signal with the same duty ratio as in cases where the input signal is small. Furthermore, the "non-saturated region" of the curve B0 refers to a region in which the slope of the current-voltage characteristic curve is large (i. e., a region in which the rate at which the voltage increases relative to the rate at which the current increases is small), as in the case of the region between 0 and V4 in FIG. 3. Furthermore, the "region of the same voltage values as in a case where the input signal is a small signal" refers to the region of the voltage values V2 through V4.

Generally, in the non-saturated region of the current-voltage characteristic curve, the enhancement type FET 222 functions as a resistance element whose resistance value corresponds to the slope of the curve, while in the saturated region, this FET 222 functions as a resistance element which has a resistance value that is equal to the reciprocal 1/Gd of the drain conductance of the FET 222 (here, Gd is the drain conductance).

When the value of the gate voltage Vgs of the enhancement type FET 222 is small, the value of the drain-source current Ids that flows is also small; furthermore, the value of the drain-source voltage Vds at which the drain-source current Ids becomes saturated is also small. Accordingly, in the present embodiment, the drain-source voltage Vds of the enhancement type FET 222 is set so that the FET 222 operates in the saturated region in cases where the input signal is a small signal.

In cases where a small signal current is input from the input terminal 110, such an enhancement type FET 222 functions as a resistance element which has a resistance value that is equal to the reciprocal 1/Gd of the drain conductance (here, Gd is the drain conductance) of the FET 222 (i. e., as a resistance element which has an extremely large resistance value).

Furthermore, in cases where a large signal current is input from the input terminal 110, the enhancement type FET 222 functions as a resistance element which has a resistance value that corresponds to the slope of the curve B1 (i. e., as a resistance element which has a small resistance value).

In either case, the effect of the Schottky current S is extremely small compared to the ambiguity (the minimum value of the voltage amplitude at which a limiting amplifier can distinguish between "0" ad "1"), and can therefore be ignored.

In the current-voltage conversion circuit 100, as was described above, the gate potential of the inverter INV0 is determined in accordance with the mean value of the output voltage of the inverter INVn. Accordingly, as in a conventional current-voltage conversion circuit 800, the voltage value that constitutes the center of the amplitude of the input signal and the logical threshold value of the inverter can be caused to coincide. Accordingly, the duty ratio of the voltage signal that is output from the output terminal 120 can be set at 50%.

In the current-voltage conversion circuit 100 of the present embodiment, as was described above, a loop consisting of an odd number of inverters INV1 through INVn and INV0 is constructed, and an integrating circuit 130 consisting of a resistance element 131 and a capacitor 132 is provided. Accordingly, as in the case of a conventional current-voltage conversion circuit 800 (see FIG. 8), the voltage value that constitutes the center of the amplitude of the input signal and the logical threshold value of the inverter INV1 can be caused to coincide. Furthermore, the final-stage amplifying inverter INVn+1 amplifies the signal that is output by the nth-stage amplifying inverter INVn to the limiting value of the output amplitude in the case of the region of the voltage values V2 through V4 contained in the signal, excludes the regions outside the voltage values V2 through V4, and outputs the signal to the output terminal 120.

Moreover, in the current-voltage conversion circuit 100 of the present embodiment, the current-voltage characteristics of the negative feedback inverter INV0 can be varied in accordance with the amplitude of the current signal that is input from the input terminal 110.

Accordingly, in the present embodiment, since the amplitude of the input signal is large in cases where the input signal is a large signal, the current-voltage conversion circuit 100 can obtain a high sensitivity with respect to the input signal. Furthermore, since the resistance value of the negative feedback inverter can be varied in accordance with the amplitude of the input signal, and since the voltage signal in the vicinity of the center of the amplitude can be amplified, distortion can be prevented in the waveform of the voltage signal that is input into the amplifying inverters.

Furthermore, in the current-voltage conversion circuit 100, since the FET 222 installed inside the negative feedback inverter INV0 functions as a resistance element that has an extremely large resistance value, a high sensitivity can be obtained with respect to the input signal even in cases where the input signal is a small signal.

In the conventional current-voltage conversion circuit 800, since the resistance value of the resistance element 708 inside the negative feedback circuit is fixed, there may be instances in which the signal that is input into the negative feedback circuit shifts to a low level before reaching a high level in cases where the input signal is a large signal. In such cases, since the high level region of the signal that is input into the negative feedback circuit is eliminated, this conventional current-voltage conversion circuit 800 shows distortion in the waveform input.

In the current-voltage conversion circuit 100 of the present invention, on the other hand, the resistance value of the negative feedback inverter INV0 drops in cases where the input signal is a large signal; accordingly, the input signal that is input into the negative feedback circuit does not shift to a low level before reaching a high level. Accordingly, since the high level region of the signal that is input into the negative feedback circuit is not eliminated, the current-voltage conversion circuit 100 does not show any generation of distortion in the input waveform.

<Second Embodiment>

Next, a current-voltage conversion circuit constituting a second embodiment of the present invention will be described with reference to FIG. 4.

Figure 4:
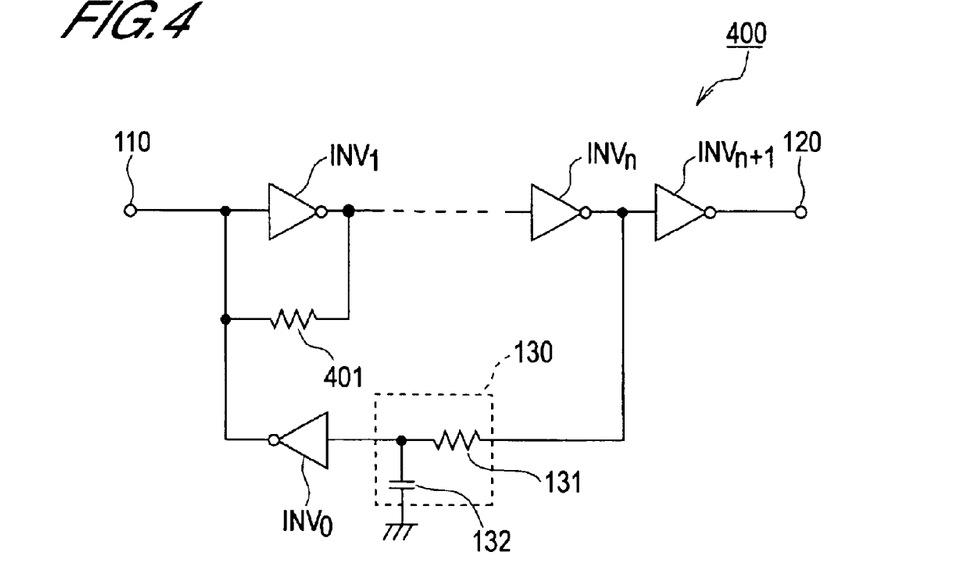
FIG. 4 is a circuit diagram which shows the construction of a current-voltage conversion circuit constituting a second embodiment of the present invention.

In FIG. 4, those constituent elements that are identified by the same symbols as in FIG. 1 are elements that are the same as those of the circuit in FIG. 1.

Figure 10:
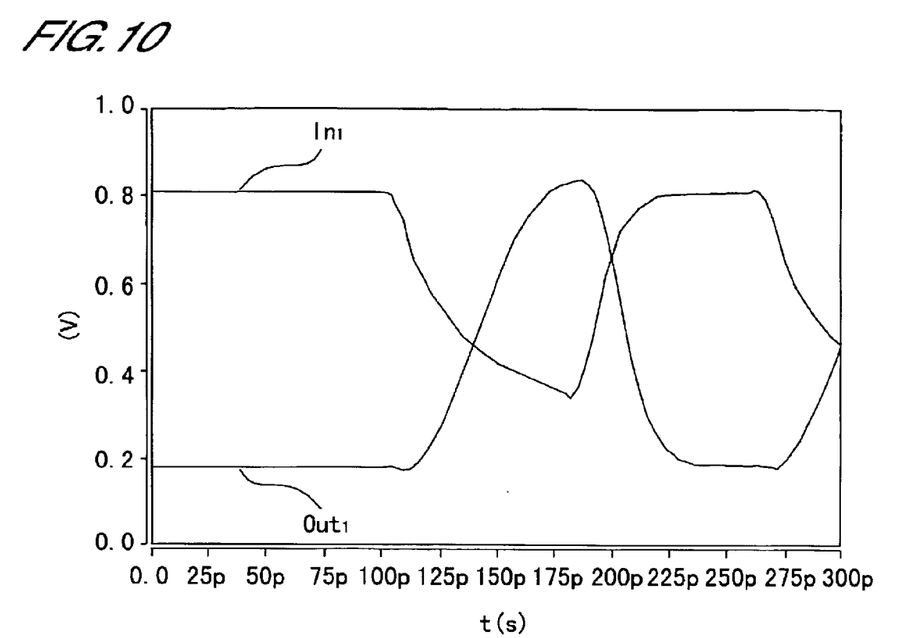
FIG. 10 is a waveform diagram of the input voltage and output voltage of the amplifying inverter INV1 in the first embodiment.
Figure 11:
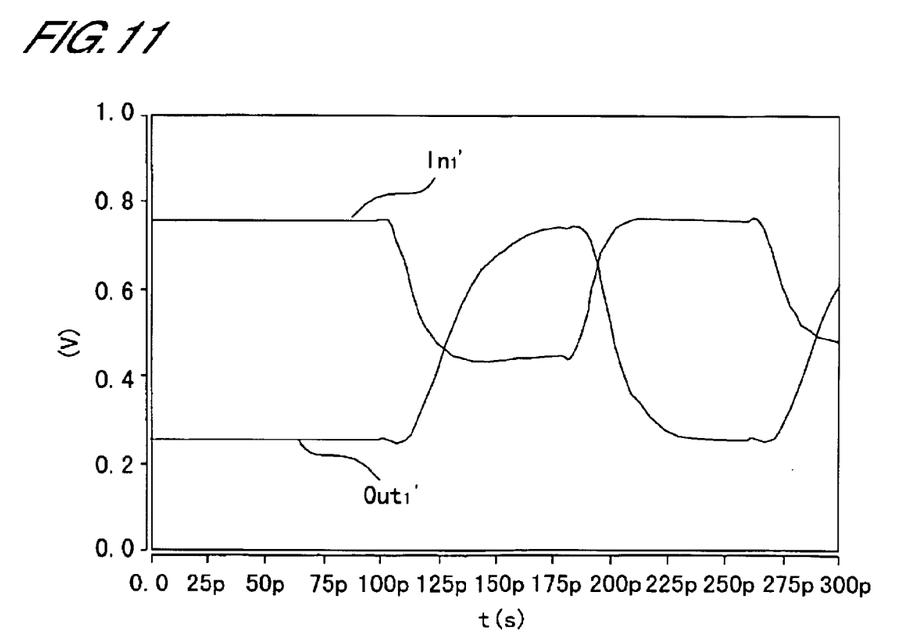
FIG. 11 is a waveform diagram of the input voltage and output voltage of the amplifying inverter INV1 in the second embodiment.

The current-voltage conversion circuit 400 of the present embodiment differs from the current-voltage conversion circuit 100 of the abovementioned first embodiment in that a resistance element 401 used as a negative feedback element is provided. As a result, the waveforms of the input voltage and output voltage of the amplifying inverter INV1 show the differences indicated in FIGS. 10 and 11. Furthermore, FIG. 10 is a waveform diagram of the input voltage and output voltage of the amplifying inverter INV1 in the first embodiment. FIG. 11 is a waveform diagram of the input voltage and output voltage of the amplifying inverter INV1 in the second embodiment. The vertical axes in FIGS. 10 and 11 indicate the voltage value, and the horizontal axes indicate time.

Compared to the waveforms of the input voltage In1 and output voltage Out1 of the first embodiment shown in FIG. 10, the waveforms of the input voltage In1' and output voltage Out1' of the second embodiment shown in FIG. 11 both have a smaller amplitude; furthermore, the rectangularity in the case of a transition from the high level to the low level and the case of a transition from the low level to the high level is evident. Such differences arise from the principle described below.

Specifically, one end of the resistance element 401 is connected to the output of the first-stage amplifying inverter INV1, and the other end is connected to the input of this inverter INV1.

In cases where the input potential of the first-stage amplifying inverter INV1 is lower than the threshold value, the output potential of this inverter INV1 is higher than the threshold value. Accordingly, in this case, current flows from the output side of the inverter INV1 toward the input side via the resistance element 401. Conversely, in cases where the input potential of the first-stage amplifying inverter INV1 is higher than the threshold value, the output potential of this inverter INV1 is lower than the threshold value. Accordingly, in this case, current flows from the input side of the inverter INV1 toward the output side voice information the resistance element 401.

As a result, the amplification rate of the inverter INV1 is smaller than in a case where there is no resistance element 401. Specifically, in this embodiment, the amplitude of the output voltage of the inverter INV1 can be suppressed to a smaller value than in the first embodiment in cases where the amplitude of the current that is input from the input terminal 110 is large.

Moreover, in the present embodiment, a charge flows out to the ground line via the resistance element 401 and enhancement type FET 212 (see FIG. 2) when the input voltage of the amplifying inverter INV1 makes a transition from the high level to the low level; accordingly, the transition time is shortened.

Conversely, when the input voltage of the amplifying inverter INV1 makes a transition from the low level to the high level, a charge flows into the input of the inverter INV1 via the depression type FET 211 (see FIG. 2) and resistance element 401; accordingly, the transition time is shortened.

Specifically, in the present embodiment, the speed of the operation of the current-voltage conversion circuit can be increased in either case.

In the current-voltage conversion circuit 400 of the present embodiment, as was described above, the speed of operation can be increased even further than in the circuit 100 of the first embodiment.

<Third Embodiment>

Next, a current-voltage conversion circuit constituting a third embodiment of the present invention will be described with reference to FIG. 5.

The current-voltage conversion circuit 500 of this embodiment differs from the current-voltage conversion circuit 100 of the abovementioned first embodiment and the current-voltage conversion circuit 400 of the second embodiment in that logical threshold value of an earlier-stage amplifying inverter is higher than the logical threshold values of later-stage amplifying inverters.

Figure 5:
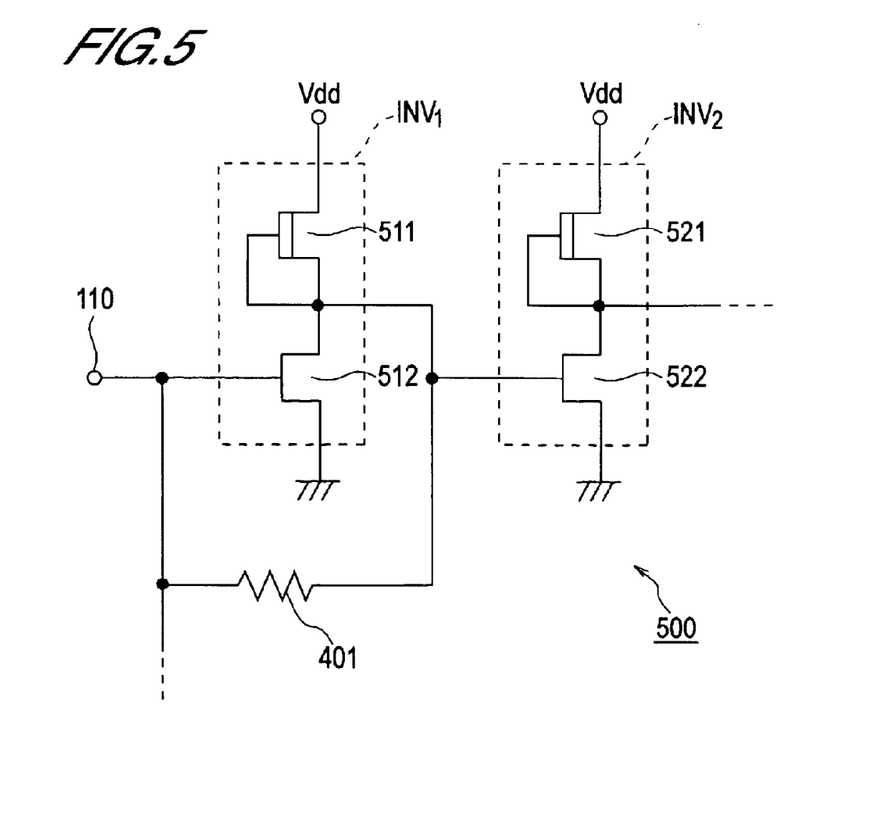
FIG. 5 is a circuit diagram which shows the essential construction of a current-voltage conversion circuit constituting a third embodiment of the present invention.

FIG. 5 is a circuit diagram which shows the essential construction of the current-voltage conversion circuit 500 of the present embodiment. FIG. 5 shows the constructions of an first-stage amplifying inverter INV1 and a second-stage amplifying inverter INV2. Furthermore, in FIG. 5, constituent elements identified by the same symbols as in FIG. 4 indicate the same elements as in the circuit shown in FIG. 4.

As is shown in FIG. 5, the first-stage inverter INV1 comprises a depression type FET 511 and an enhancement type FET 512. Furthermore, the second-stage inverter INV2 comprises a depression type FET 521 and an enhancement type FET 522. The connection relationships of the respective FETs 511, 512, 521 and 522 are the same as in the inverters of the first embodiment and second embodiment (see FIG. 2).

As was described above, the first-stage amplifying inverter INV1 is constructed so that the logical threshold of the first-stage amplifying inverter INV1 is higher than the logical threshold values of the amplifying inverters INV2 through INVn+1 of the second stage on. For example, if the ratio W511/W512 of the gate width W511 of the depression type FET 511 to the gate width W512 of the enhancement type FET 512 is set so that this ratio is greater than the ratio W521/W522 of the gate width W521 of the depression type FET 521 to the gate width W522 of the enhancement type FET 522, then the logical threshold value of the amplifying inverter INV1 will be higher than the logical threshold value of the amplifying inverter INV2.

Figure 12:
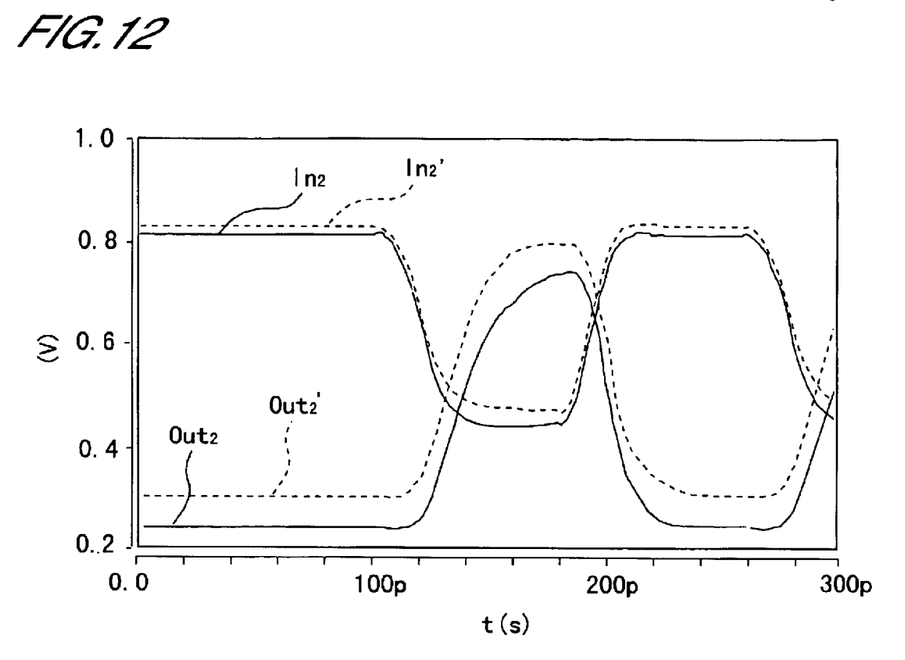
FIG. 12 is a waveform diagram of the input voltage and output voltage of the amplifying inverter INV1 in the second embodiment and third embodiment.

FIG. 12 is a waveform diagram of the input voltage and output voltage of the amplifying inverter INV1 in the second embodiment and third embodiment. In each figure, the vertical axis indicates the voltage value, and the horizontal axis indicates time.

The solid lines indicate the waveforms in the second embodiment. In the second embodiment, the logical threshold value of the first-stage amplifying inverter is lower than the logical values of the amplifying inverters from the second stage on. Here, the gate widths in the solid lines are such that W511 is 12 $\mu$m, W512 is 24 $\mu$m, W521 is 12 $\mu$m and W522 is 24 $\mu$m.

The dotted lines indicate the waveforms in the third embodiment. In the third embodiment, the logical threshold value of the first-stage amplifying inverter is higher than the those of the amplifying inverters from the second stage onwards. Here, the gate widths in the dotted lines are such that W511 is 16 $\mu$m, W512 is 24 $\mu$m, W521 is 12 $\mu$m and W522 is 24 $\mu$m.

As is shown in FIG. 12, the waveforms of the input voltage In2' and output voltage Out1' in the third embodiment both show higher voltage values than the waveforms of the input voltage In2 and output voltage Out2 in the second embodiment. Furthermore, the waveform of the output voltage Out1' in the third embodiment shows a quicker rise and clearer rectangularity in the case of a transition from the low level to the high level than the waveform of the input voltage Out2 in the second embodiment.

Figure 13:
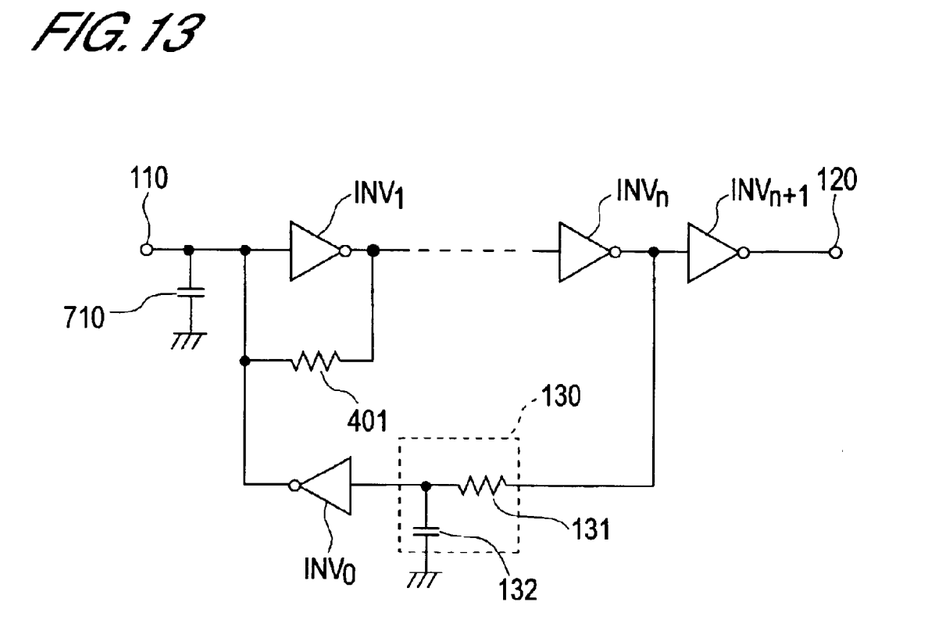
FIG. 13 is a diagram which shows the construction of a circuit in which parasitic capacitance is added.
Figure 14:
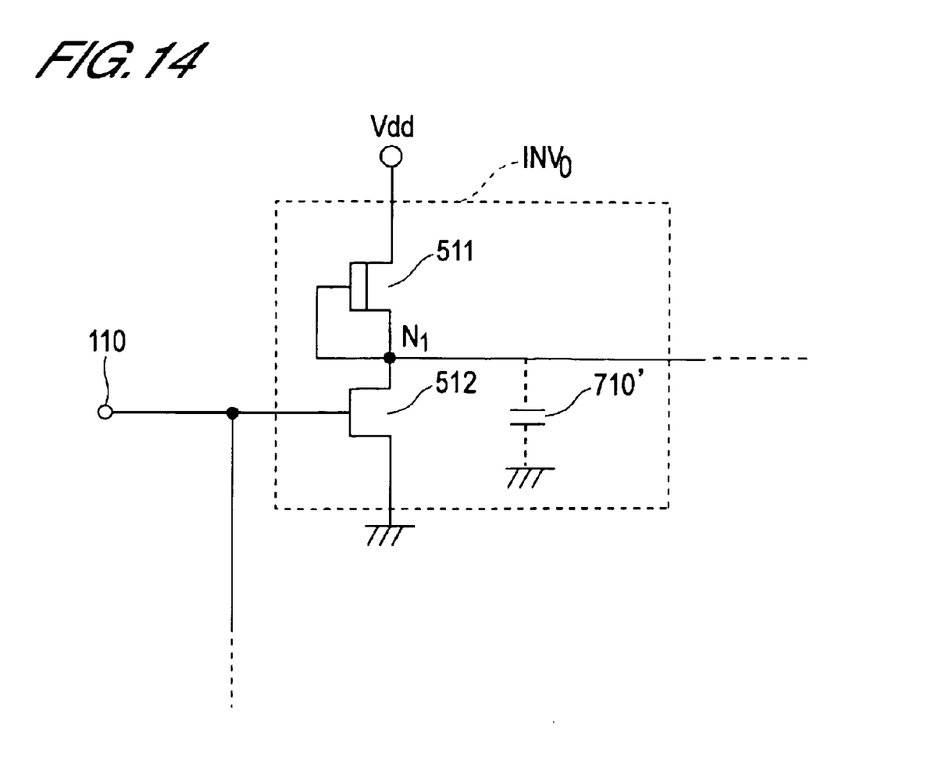
FIG. 14 is a diagram which shows the construction of a circuit in which parasitic capacitance is added.

In the present embodiment, as a result of such a construction, the voltage value of the input signal at which the enhancement type FET 512 is switched off when the input signal of the inverter INV1 makes a transition from the high level to the low level is higher than in the case of the second embodiment. Accordingly, the voltage across the terminals of the resistance element 401 is also larger than in the case of the second embodiment. As a result, the current that flows from the input side of the inverter INV1 toward the output side via the resistance element 401 in this case is larger than in the case of the second embodiment. This current charges and discharges the parasitic capacitance 710 that is generated in the wiring between the input terminal 110 and the first-stage amplifying inverter INV1 as shown in FIG. 13 and the parasitic capacitance 710' that is present in the load of the first-stage amplifying inverter INV1 as shown in FIG. 14. Accordingly, as this current increases, the rise in the case of a transition of the first-stage amplifying inverter INV1 from the low level to the high level becomes more rapid; consequently, the operation of the first-stage amplifying inverter INV1 becomes faster, and as a result, the operating speed of the second-stage amplifying inverter INV2 is also increased. Furthermore, FIGS. 13 and 14 show the constructions of the circuits with the parasitic capacitance applied.

Thus, in the current-voltage conversion circuit 500 of the present embodiment, the current that is drawn in via the resistance element 401 can be increased; accordingly, the operating speed can be increased even further than in the case of the second embodiment.

<Fourth Embodiment>

Next, a current-voltage conversion circuit constituting a fourth embodiment of the present invention will be described with reference to FIG. 6.

Figure 6:
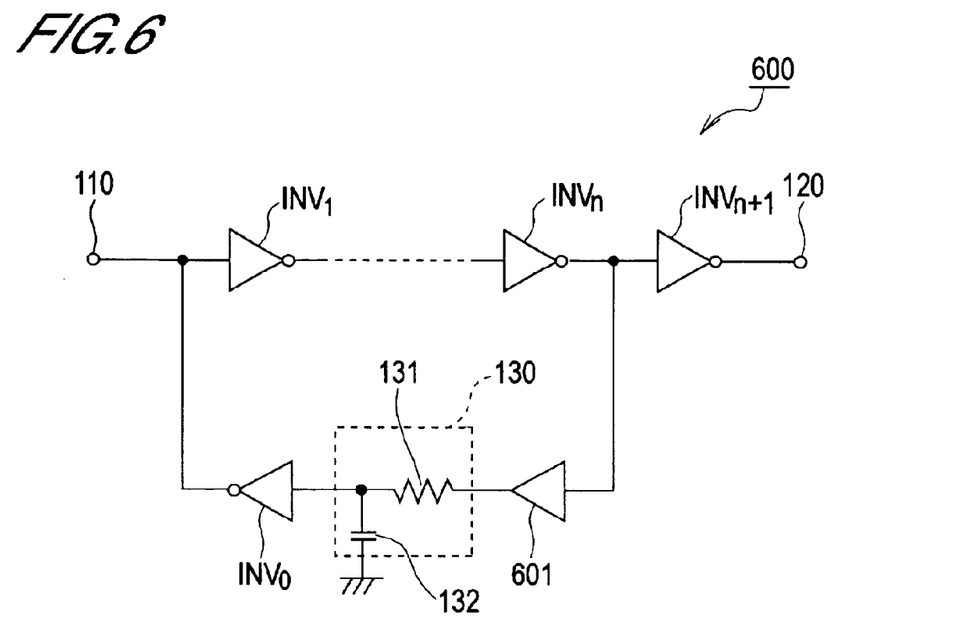
FIG. 6 is a circuit diagram which shows the construction of a current-voltage conversion circuit constituting a fourth embodiment of the present invention.

In FIG. 6, those constituent elements that are identified by the same symbols as in FIG. 1 are elements that are the same as those of the circuit in FIG. 1.

The current-voltage conversion circuit 600 of this embodiment differs from the current-voltage conversion circuit 100 of the abovementioned first embodiment in that an amplifier 601 is provided.

As was described above, the mean value of the output voltage of the nth-stage amplifying inverter INVn is applied to the input of the negative feedback inverter INV0. Here, in order to cause the center voltage value of the input signal and the logical threshold value to coincide with a high degree of precision, it is desirable that the difference $\Delta V_{n+1}$ between the center voltage value of the output signal of the nth-stage amplifying inverter INVn and the threshold value of the amplifying inverter INVn+1 be reduced to a small value. The reason for this is that the duty ratio of the signal that is output from the amplifying inverter INVn+1 is distorted by this difference $\Delta V_{n+1}$.

In this regard, the current-voltage conversion circuit 600 of the present embodiment is equipped with an amplifier 601. Accordingly, if the circuit 600 is constructed so that the threshold values of the amplifying inverter INVn and INVn+1 are more or less equal, and so that these threshold values are equal to the mean value of the output voltage of the amplifying inverter INVn, the difference $\Delta V_{n+1}$ can be reduced to 1/g of that in the case of the first embodiment (g is the amplification rate of the amplifier 601). Consequently, in the current-voltage conversion circuit 600 o the present embodiment, the difference $\Delta V_{n+1}$ can be reduced to a smaller value than in the first embodiment, so that the distortion of the duty ratio of the signal that is output from the amplifying inverter INVn+1 can be reduced to a smaller value than in the first embodiment. As a result, the current-voltage conversion circuit 600 makes it possible to cause the center voltage value of the input signal and the threshold value to coincide with a high degree of precision.

Here, furthermore, an example was described in which an amplifier 601 was added to the current-voltage conversion circuit 100 of the first embodiment; however, a similar effect can also be obtained in cases where such an amplifier is added to the current-voltage conversion circuit 400 or 500 of the second or third embodiment.

<Addendum>

In the working of the present invention, the present invention may adopt the following preferred constructions.

In the first through fourth embodiments, the integrating circuit 130 was connected to an even-numbered amplifying inverter. However, if (for example) an even number of negative feedback inverters are used, it would also be possible to connect the integrating circuit 130 to an odd-numbered amplifying inverter. In other words, a similar effect can be obtained in cases where the loop consisting of amplifying inverters and negative feedback inverters is a negative feedback loop.

Furthermore, in the first through fourth embodiment, each inverter was a DCFL consisting of a GaAs MESFET. However, a similar effect can also be obtained in the case of inverters constructed using nMOS transistors or the like.

As was described above in detail, the present invention makes it possible to provide a current-voltage conversion circuit which has a high sensitivity in cases where the amplitude of the input signal is small, and in which the waveform is resistant to distortion even in cases where the amplitude of the input signal is large.

What is claimed is:

1. A current-voltage conversion circuit comprising:
   a plurality of amplifying inverters that are connected in series between an input terminal and an output terminal;
   an integrating circuit which inputs and integrates an output potential of one of said amplifying inverters; and
   a negative feedback inverter which controls a current that flows between said input terminal and a power supply line in accordance with the output voltage of said integrating circuit,
   wherein the logical threshold values of said plurality of amplifying inverters are set so that the logical threshold value of an earlier stage is higher than the logical threshold values of the later stages.

2. The current-voltage conversion circuit according to claim 1, wherein in cases where the signal that is input from said input terminal is a small signal, said negative feedback inverter outputs a signal along a saturated region of its current-voltage characteristic curve corresponding to said small signal, and in cases where the signal that is input from said input terminal is a large signal, said negative feedback inverter outputs a signal along a non-saturated region of its current-voltage characteristic curve corresponding to said large signal.

3. The current-voltage conversion circuit according to claim 2, wherein in the cases where the input signal is a large signal, the signal outputted by said negative feedback inverter has voltages in a range which overlaps those of the signal outputted by said negative feedback inverter in the cases where the input signal is a small signal.

4. The current-voltage conversion circuit according to claim 1, wherein the number of said negative feedback inverters is an odd number in cases where one end of a negative feedback circuit comprising said integrating circuit and said negative feedback inverters is connected to the output side of an even-numbered amplifying inverter, and the number of said negative feedback inverters is an even number in cases where one end of said negative feedback circuit is connected to the output side of an odd-numbered amplifying inverter.

5. The current-voltage conversion circuit according to claim 1, further comprising a negative feedback element, one end of which is connected to the output terminal of said first-stage amplifying inverter, and the other end of which is connected to the input terminal of this amplifying inverter.

6. The current-voltage conversion circuit according to claim 1, further comprising an amplifier that amplifies said output potential of one of said amplifying inverters and supplies this amplified potential to said integrating circuit.

7. The current-voltage conversion circuit according to claim 5, wherein said negative feedback element is a resistive element.

8. A current-voltage conversion circuit comprising:
   a plurality of amplifying inverters that are connected in series between an input terminal and an output terminal;
   an integrating circuit which inputs and integrates an output potential of one of said amplifying inverters; and
   a negative feedback inverter which controls a current that flows between said input terminal and a power supply line in accordance with the output voltage of said integrating circuit, wherein the negative feedback inverter has a depression type transistor and an enhancement type transistor, in which a source of said depression type transistor is connected to said power supply line, a gate and a drain of said depression type transistor is connected to a node which is an output of said negative feedback inverter, a drain of said enhancement type transistor is connected to said node which is an output of said negative feedback inverter, a gate of said enhancement type transistor is connected to an output of said integrating circuit, and a source of said enhancement type transistor is connected to a ground line.

9. The current-voltage conversion circuit according to claim 8, wherein one end of a negative feedback circuit comprising said integrating circuit and said negative feedback inverters is connected to the output side of an even-numbered amplifying inverter.

10. The current-voltage conversion circuit according to claim 8, wherein in cases where the signal that is input from said input terminal is a small signal, said negative feedback inverter outputs a signal along a saturated region of its current-voltage characteristic curve corresponding to said small signal, and in cases where the signal that is input from said input terminal is a large signal, said negative feedback inverter outputs a signal along a non-saturated region of its current-voltage characteristic curve corresponding to said large signal.

11. The current-voltage conversion circuit according to claim 10, wherein in the cases where the input signal is a large signal, the signal outputted by said negative feedback inverter has voltages in a range which overlaps those of the signal outputted by said negative feedback inverter in the cases where the input signal is a small signal.

12. The current-voltage conversion circuit according to claim 8, wherein the number of said negative feedback inverters is an odd number in cases where one end of a negative feedback circuit comprising said integrating circuit and said negative feedback inverters is connected to the output side of an even-numbered amplifying inverter, and the number of said negative feedback inverters is an even number in cases where one end of said negative feedback circuit is connected to the output side of an odd-numbered amplifying inverter.

13. The current-voltage conversion circuit according to claim 8, further comprising a negative feedback element, one end of which is connected to the output terminal of said first-stage amplifying inverter, and the other end of which is connected to the input terminal of this amplifying inverter.

14. The current-voltage conversion circuit according to claim 8, wherein the logical threshold values of said plurality of amplifying inverters are set so that the logical threshold value of an earlier stage is higher than the logical threshold values of the later stages.

15. The current-voltage conversion circuit according to claim 8, further comprising an amplifier that amplifies said output potential of one of said amplifying inverters and supplies this amplified potential to said integrating circuit.

16. The current-voltage conversion circuit according to claim 13, wherein said negative feedback element is a resistive element.

17. A current-voltage conversion circuit comprising:
a plurality of amplifying inverters that are connected in series between an input terminal and an output terminal;
an integrating circuit which inputs and integrates an output potential of one of said amplifying inverters; and
a negative feedback inverter which controls a current that flows between said input terminal and a power supply line in accordance with the output voltage of said integrating circuit,
wherein the negative feedback inverter has a first conductivity type transistor and a second conductivity type transistor, in which an electrode on one side of said first conductivity type transistor is connected to said power supply line, a gate and an electrode on the other of said first conductivity type transistor is connected to a node which is an output of said negative feedback inverter, an electrode on one side of said second conductivity type transistor is connected to said node which is an output of said negative feedback inverter, a gate of said second conductivity type transistor is connected to an output of said integrating circuit, and an electrode on the other of said second conductivity type transistor is connected to a ground line.

* * * * *